United States Patent [19]
Fujimura

[11] 4,155,060
[45] May 15, 1979

[54] ROTARY PRESET TUNER

[76] Inventor: Hisao Fujimura, c/o Nihon Technical Kabushiki Kaisha, No. 13-2 Takada 3-chome, Toshima-ku, Tokyo, Japan

[21] Appl. No.: 809,917

[22] Filed: Jun. 24, 1977

[30] Foreign Application Priority Data

Jun. 29, 1976 [JP] Japan .................................. 51/76645
Jul. 7, 1976 [JP] Japan .................................. 51/80661
Jan. 18, 1977 [JP] Japan .................................. 52/4152

[51] Int. Cl.² ............................................. H03J 5/26
[52] U.S. Cl. .................................... 334/56; 74/10.41; 74/10.6; 334/74
[58] Field of Search ........................... 334/47, 56–58, 334/74–77; 74/10.2, 10.41, 10.6, 10.85

[56] References Cited
U.S. PATENT DOCUMENTS

| | | | |
|---|---|---|---|
| 2,534,768 | 12/1950 | Hall | 334/77 X |
| 2,580,895 | 1/1952 | De Tar | 334/77 X |
| 2,983,885 | 5/1961 | Thomson | 334/77 X |
| 3,675,496 | 7/1972 | Yasuda et al. | 74/10.6 |
| 3,808,896 | 5/1974 | Ogasawara et al. | 74/10.6 |
| 3,866,479 | 2/1975 | Miner | 74/10.85 |

FOREIGN PATENT DOCUMENTS

13041 5/1975 Japan.

*Primary Examiner*—Paul L. Gensler
*Attorney, Agent, or Firm*—Lane, Aitken & Ziems

[57] ABSTRACT

A rotary preset tuner comprising a plurality of adjustable memory slugs, a single tuning member capable of being rotated in any direction, a sliding member connected to variable condenser elements and arranged so as to enable reciprocating movement thereof along guide members, and a sliding member reciprocation means for reciprocating the sliding member by rotating the tuning member. Tuning is provided by rotating the tuning member and reciprocating the sliding member to select a desired one of the plurality of adjustable memory slugs, the sliding member being resiliently abutted against the selected memory slug.

8 Claims, 12 Drawing Figures

ROTARY PRESET TUNER

BACKGROUND OF THE INVENTION

This invention relates to rotary preset tuners, and more particularly to improvements of such tuners wherein a desired one of a plurality of memory slugs is selected by the rotating operation of a tuning member capable of being rotated in any direction and the reciprocating movement of a sliding member connected to variable condenser elements. The sliding member is resiliently abutted against the selected memory slug to provide the tuning operation.

Prior art rotary preset tuners have been constructed such that when a tuning member is rotated to provide a tuning operation, the memory slugs slide and move on a guide cam face of a sliding plate or a sliding member to provide resilient abutting against a subsequent memory slug. Due to such construction, undesirable force necessarily acts upon the sliding plate, resulting in either a stress or a strain on the sliding plate itself and a guide portion of the sliding plate. When such prior art tuners are installed in a vehicle such as an automobile, this stress or strain may be released by the external vibration of the vehicle. As a result, the sliding plate will be slightly displaced with respect to the memory slugs against which the sliding plate is resiliently abutted and thus a fluctuation of tuning frequency is generated. For example, a displacement of the sliding plate by 0.01 mm will cause a fluctuation of frequency. If the fluctuation of this frequency is 3 KHz or more, the tuner will no longer be useable.

Further, when the above described sliding movement of the memory slugs is repeated for long period of time, the resiliently abutted surfaces between the memory slugs and the sliding plate will wear out and the preset position of the memory slugs may change to cause a fluctuation of frequency.

SUMMARY OF THE INVENTION

It is, therefor, a main object of the present invention to provide an improved rotary present tuner constructed such that unwanted force is not applied to the sliding member or the sliding plate so that there will be no change in the accuracy ot tuning even if the tuner is used for long period of time.

It is a further object of the present invention to provide an improved rotary preset type tuner in which the accuracy of tuning is not affected during use over a long period of time and which permits at the same time tuning to be performed easily.

Other objects and advantages of the present invention will become apparent to those skilled in the art from a reading of the detailed description of the preferred embodiment to follow, taken in conjunction with the attached drawings.

DESCRIPTION OF THE DRAWINGS

In the drawing are shown the major features of each of the embodiments of the present invention in which features well known to those skilled in the art have been eliminated where possible.

DESCRIPTION OF THE PREFERRED EMBODIMENT

Figure 1:
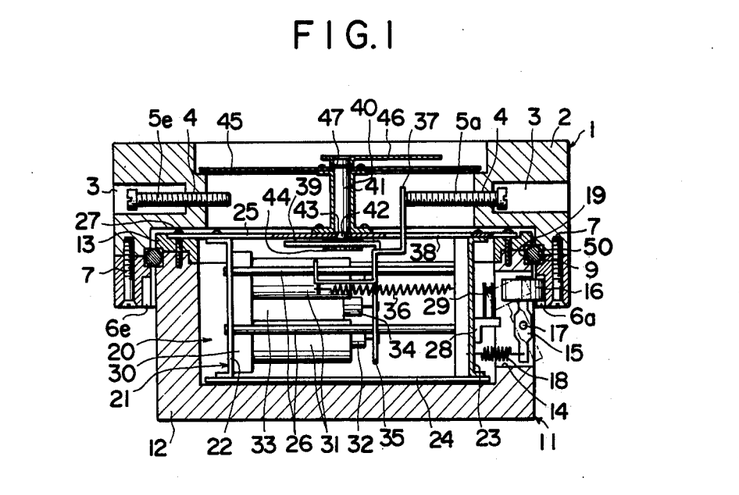
FIG. 1 is a side elevational view with the outside component portions being broken away to show an inner structure of a first embodiment constructed in accordance with the present invention.
Figure 2:
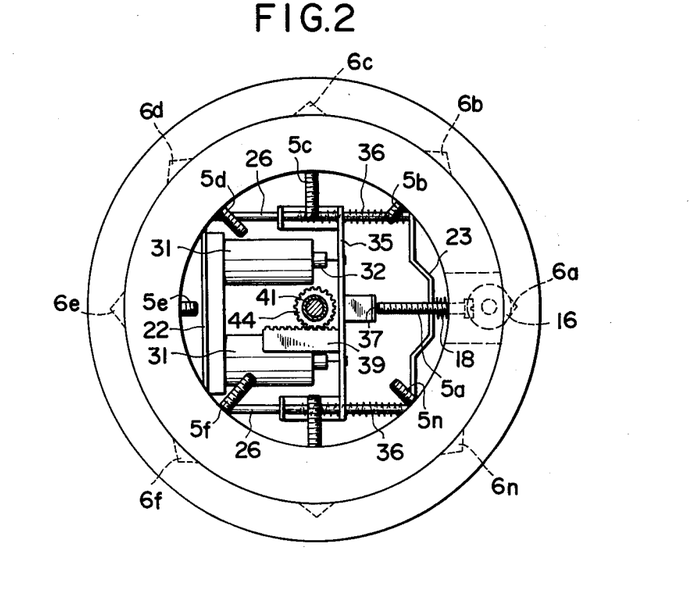
FIG. 2 is a top plan view of FIG. 1 with a portion of component parts being broken away to show the relation between the set screws and the sliding bars.
Figure 3:
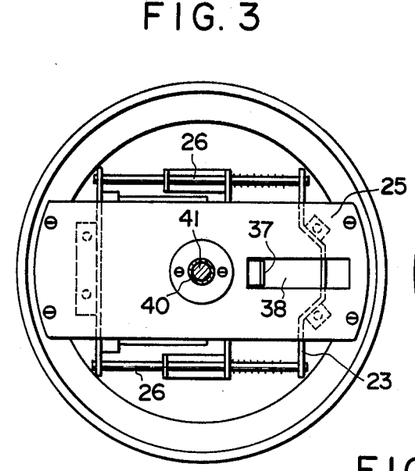
FIG. 3 is a top plan view showing only an inner mechanism of the present invention.

With reference to FIGS. 1 to 3, a first embodiment of the present invention will be described.

In these figures, reference numeral 1 is a set drum or tuning member, and refereence numeral 11 is a cylindrical case having a bottom in which a main body 20 of tuner is stored and fixed therein.

The set drum 1 is constructed such that a groove 9 is applied at the entire inner circumference of a doughnut-shaped major body 2 of the set drum 1. Likewise, a groove 19 is applied at the entire outer circumference of the case 11. Both grocves face each other and are rotatably fitted via a rotating ring 50 which is fitted into these grooves.

The major body 2 is assembled with a plurality of small screws 7 with the lower surface of the upper body and the upper surface of lower the body divided into upper and lower parts by the formed groove 9 facing each other. The major body 2 may thereby be fitted to the case 11 into which the rotating ring 50 is inserted. The doughnut-shaped major body 2 of said set drum 1 is further provided with a number of set holes 3 in a suitable spacial relation from outer circumference side thereof to a central part thereof. Each of central threaded holes 4 are provided at the bottom of each of the set holes 3 to be threadably engaged with set screws designated at 5a, 5b,......5n for conveniences sake. These set screws 5a, 5b,......5n are abutted against an abutting piece 37 to be described later. Any one of these set screws may be extracted or retracted in a radial central direction by rotating them with a screw driver and the amount of projection in a radial central direction of the set drum 1 may thereby be changed. Each of the threaded holes 4 is positioned at the inner circumference surface of the main body 2. A roller 16 rotatably attached on the upper end of a stopper 15 to be described later may be inserted in V-shaped recesses 6a, $6b, \ldots 6n$ in which the roller is engaged to provide a stepwise movement for holding or keeping the set drum 1 stationary until some strong rotational force is applied thereto.

The cylindrical case 11 is comprised of a cylindrical main body having at its bottom a through-hole 14 at the side wall thereof and an interchangeable ring body 13 which may be mounted and fixed at the upper end of cylindrical wall of the main body 12 and which is used for adjusting height.

In the through-hole 14, the stopper 15 is pivotably arranged by a shaft 17, the lower end of the stopper is extracted by a spring 18 which is provided between a lower end and a frame 23 of the tuner frame 21 to be described later. The roller 16, which is rotatably attached on the upper end thereof, is separately engaged in the V-shaped recesses $6a, 6b, \ldots 6n$ formed at inner circumference surface of the main body 2 of set drum 1 when the set drum 1 is rotated as described above.

The main body 20 of the tuner comprises a tuner frame 21 which has right and left frames 22 and 23, a bottom frame 24 and top plate 25 connected to each other by the frames 22 and 23, and four parallel rods 26, two upper and two lower, arranged between left and right frames 22 and 23. The tuner frame 21 is constructed such that both ends of the top plate 25 are mounted on the case 11 and are steadily fixed to the case 11 by screws 27.

A base 30 is fixed to the left frame 22 and both tuning coils 31 and solenoid coils 33 are fixed to their base 30. The leading ends of magnetic cores (inner core) 32 are to be moved in or away from the tuning coils 31 and the leading ends of movable iron core 34 of the solenoid coils 33 are fixed and connected to a sliding plate or member 35 slidably supported on the parallel rods 26. Between the sliding bar 35 and the right frame 23 is arranged a spring 36. The sliding plate 35 is always biased in a direction for drawing the magnetic core 32 and the movable iron core 34 from the tuning coil 31 and the solenoid coil 33.

An abutting piece 37 formed by extending and bending a portion of upper end of said sliding plate 35 is projected upward through a longitudinal hole 38 provided at top plate 25 and is separately abutted against the corresponding set screws $5a, 5b, \ldots 5n$ when the roller 16, rotatably attached on the upper end of the stopper 15 as described above, is separately engaged with the V-shaped recesses $6a, 6b, \ldots 6n$ provided at main body 2 of the set drum 1.

Similarly, the other portion of the upper end of the sliding plate 35 is bent and extended in parallel with the parallel rods 26 in a central direction to form a rack piece 39.

A cylindrical sleeve 40 is fixed on the top plate 25 about the center of the plate 25 corresponding to the rotating center of set drum 1. A smaller diameter shaft portion 42 of a lower end of a needle pointer shaft 41 is rotatably inserted into the sleeve 40 and is slightly smaller than the inner diameter of the sleeve 40 so as to extend downwardly through a hole 43 provided in top plate 25. A pointer needle pinion 44 engaged with the rack piece 39 is fixed thereto. The upper end of the pointer needle shaft 41 is projected through a scale plate 45 mounted and fixed on the sleeve 40 and 41 has a pointer 46 affixed thereto. At the same time, a shaft portion of the pointer needle shaft 41 located at a lower part of the fixed portion of the needle 46 is provided with a slit. Movement of the pointer needle shaft 41 is prevented by a washer 47 which is inserted in the slit. Thus, as the sliding plate 35 is slid along the parallel rods, the pointer 46 will be rotated.

Due to convenience in the description of the the present invention above, the explanation of a plunger switch 29 had been earlier eliminated. As can be seen from the drawings, however on a base seat 28 attached to the frame member 23 is mounted the plunger switch 29 which is closed by the roller 16 when the roller 16 of the stopper 15 is pushed out from each of the V-shaped recesses $6a, 6b, \ldots 6n$ formed in the inner circumference surface of the main body 2 of the set drum 1.

The manner of the above-described embodiment, of presetting and tuning a desired frequency, and its operation mode in reference to the presetting, will now be described.

When a preset operation is performed with the apparatus described, a set screw $5a$ is rotated by, for example a screw driver through the set hole 3 provided at the main body 2 of the set drum 1. A stroke of projection of the set screw $5a$ is thereby varied. Then, as shown in the drawing, the abutting piece 37 is integral with the sliding plate 35 and the sliding plate 35 is retracted by a spring 36, thus always being abutted against the leading end of the set screw $5a$ and the sliding plate 35 is followed by a displacement of the set screw $5a$. As a result, the relative position of magnetic core 32 to the solenoid tuning coil 31 is changed and the value of the inductance is varied. It is, thereby, possible to tune a desired frequency of a radio station by rotating the set screw $5a$.

Subsequently, in order to preset a next set screw $5b$, the main body 2 of the set drum 1 is held by operator's fingers to rotate the set drum 1 and, further, to oppositely abut the set screw $5b$ against the abutting piece 37. In this case, when the set drum 1 begins to rotate, the roller 16 is moved away from the stepwise recess $6a$. Then, as the stopper 15 is inclined as shown by a two dotted line of FIG. 1, the roller 16 closes the plunger switch 29 to energize the solenoid coil 33. Thus, the movable iron core 34 retracts the sliding plate 35 against the spring 36 and then provides a maximum retraction of the magnetic core 32 toward a tuning coil 31. When this condition occurs, even if each of the set screws $5a, 5b, \ldots 5n$ is projected to a central point in maximum length, it is made so as to not contact the abutting piece 37. The next set screw $5b$ will oppositely face the abutting piece 37 and, when the set screw $5b$ is located at a corresponding position, the roller 16 is moved into a next stepwise recess $6b$. The plunger switch 29 is then turned off, and the set screw $5b$ is resiliently contacted with the abutting piece 37. The oppositely resiliently contacted set screw $5b$ is then rotated to tune a desired frequency of radio station.

In this way, after the plurality of set screws $5a, 5b, \ldots 5n$ have been preset, a present frequency of the radio station may be generated each time the stepwise movement is terminated only by rotating the set drum 1. Thus a tuning operation may be performed. The amount of displacement of the sliding plate 35 during above described presetting operation may be indicated or shown on a reading the scale of the scale plate 45 the pointer needle 46 integral with the pointer needle shaft 41 to be rotated via both the rack piece 39 and the pointer needle pinion 44 indicates the frequency. Thus, it may be preferable to provide a scale of frequency on the scale plate 45 and to have a presetting operation for each of the set screws $5a, 5b, \ldots 5n$ with the pointer needle 46 indicating the frequency of each of the radio stations.

Recesses 6a, 6b,......6n to be used for providing a stepwise movement are formed in a symmetrical V-shaped form. The rotational direction of the set drum 1 may be either in a clockwise direction or in a counterclockwise direction and then the order of presetting the set screws 5a, 5b,......5n may not necessarily depend upon the above-described order.

A second embodiment of the present invention shown in FIGS. 4 to 7 will now be described below.

In these drawings, reference numeral 101 indicates a set drum and reference numeral 120 shows a main body of the tuner. The set drum 101 is fixed to the outer face of the bearing 149 of which inner face is attached to the outer circumference of a hollow shaft 148 of a sleeve 140 of a longitudinal I-shaped section. The latter is mounted on the top plate 125 of the tuner frame 121 to be described later. The sleeve 140 is located at a central position of the inner circumferential wall of a doughnut-shaped major body 102 of the tuner and is further rotatably mounted on the main body 120 of the tuner.

Figure 6A:
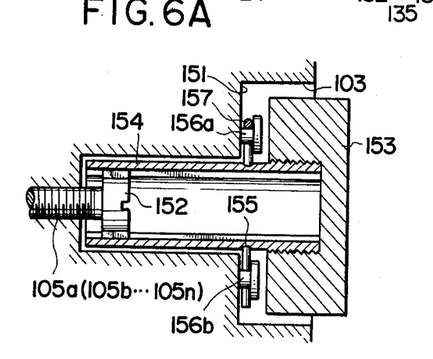
FIGS. 6(A) and (B) are views showing attachment of a manual knob in the second embodiment.
Figure 6B:
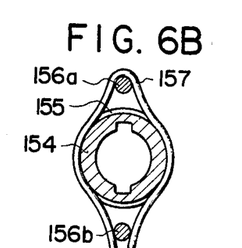

The doughnut-shaped major body 102 of the set drum 101 is provided with a number of suitably spaced apart set holes 103 which are directed to a central part from its outer circumferential surface and have steped shouldered portions 151 at their mid portions. Each of the centrally directed threaded holes 104 provided at the bottom portions of each of these set holes 103 is threadably engaged with the set screws, designaed at 105a, 105b,......105n, to be used for presetting. Ttthese set screws 105a, 105b,......105n abut against the abutting piece 137, to be described later, and have, as may be seen in each of FIGS. 6(A) and (B), a non-circular head 152. The head is inserted into a non-circular hole of a cylindrical body 154 of a manual knob 153. Therefore, each of the set screws 105a, 105b,......105n is rotated by rotating the manual knob 153 and its head 152 is moved longitudinally in the cylindrical body 154. Each of the set screws 105a, 105b,......105n is made with its amount of centrally directed projection of the set drum 1 being varied.

Each of the manual knobs 153 is made such that an annular groove 155 is provided at the outer circumference of the cylindrical body 154. A spring 157 arranged at screws 156a and 156b threadably engaged with each of the threaded holes (not shown) formed in the shouldered wall portion 151 is fitted into the annular groove 155 to prevent movement and disengagement of the cylindrical body.

Figure 4:
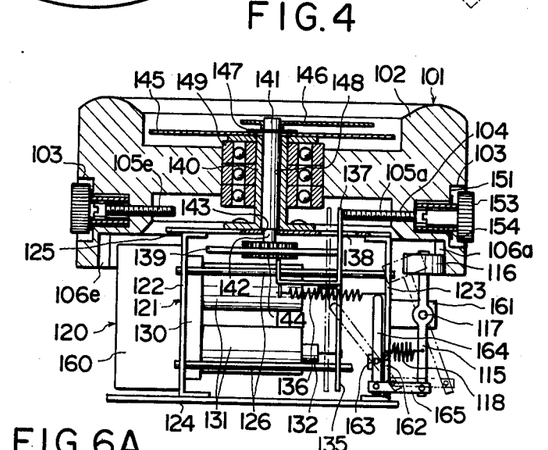
FIG. 4 is a side elevational view similar to FIG. 1 with some portions being broken away to show an inner structure of a second embodiment constructed in accordance with the present invention.
Figure 5:
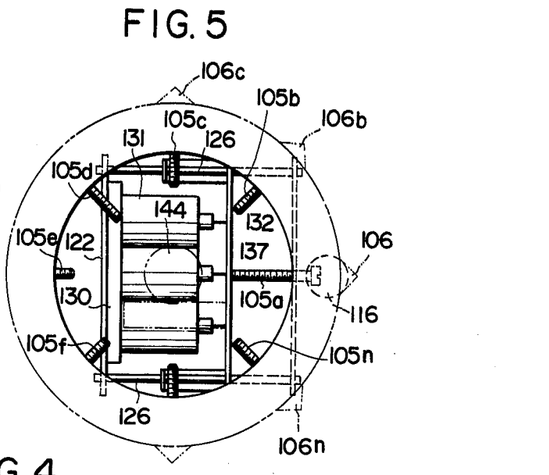
FIG. 5 is a top plan view showing the relation between the set screw and the sliding bar of the second embodiment.
Figure 7:
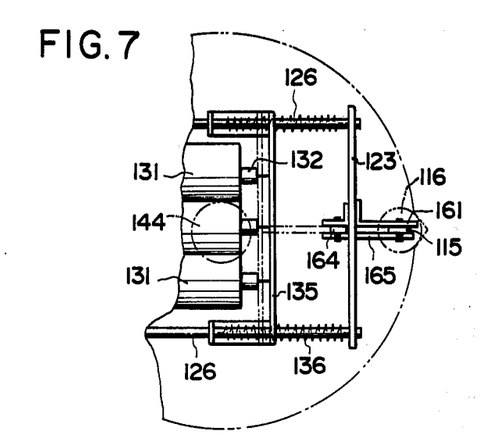
FIG. 7 is a partial view showing a relative constituent of the stopper and sliding bar in the second embodiment.

The inner circumferential surface of the major body 102 of the set drum 101, positioned below a place where each of said threaded holes 104 is provided, is formed with V-shaped recesses 106a, 106b,......106n for use in stepwise movement into which a roller 116, which is rotatably attached to the upper end of the stopper 115 to be described later, may be inserted. A condition in which the roller 116 is engaged with the recesses is thereby indicated to the operator. At the same time, the recesses are used to keep a stopped condition of the set drum 101 until a slightly strong rotational force is applied to the set drum.

The main body 120 of the tuner comprises, a tuner frame 121 formed by a left frame 122, a right frame 123, a bottom frame 124 tightly connected to the frames 122, 123, and four parallel rods 126, two upper and two lower arranged between the left frame 122 and the right frame 123.

A base 130 and a front end 160 electrically connected to the base 130 is fixed to the left from 122. A tuning coil 131 is also fixed to the base 130. A leading end of the magnetic core (inner core) 132 to be moved in or moved out from the tuning coil 131 is fixed and connected to a sliding plate 135 or a sliding member to be slidably supported by the parallel rods 126.

Between the s.iding plate 135 and the right frame 123 is arranged a spring 136. An abutting piece 137, formed by extending a portion of the upper end of the sliding plate 135 to be biased in a direction in which the magnetic core 132 is retracted from the tuning coil 131, is projected upwardly through a longitudinal hole 138 provided at the top plate 125. A rack piece 139 is formed by bending and extending the other portion of the upper end toward a central direction in parallel with the parallel rods 126.

There will now be described a mechanism for sliding the sliding plate 135 along the parallel rods 126 against the retracting force of the spring 136.

A spring 118 is arranged between the frame 123 and a lower end of the stopper 115 which is pivotally mounted, via axis 117, on the projection 161 to be projected outwardly from the right frame 123. The upper end of the right frame has a roller 116 rotatably mounted thereon. The spring causes strong and resilient contact of the roller 116 of the upper end with both the inner circumferential surface of the major body 102 of the set drum 101 and the V-shaped recesses 106a, 106b,......106m formed in the inner circumferential surface. A lower end of the lever 164, rotatably pivoted at frame 123 by a pivot 163, and a lower end of the stopper 115 are connected to each other by a link 165 so as to enable the lower portion of the lever to be moved in or away from a longitudinal hole 162 provided at the frame 123. When the roller 116 of the stopper 115 is moved to the inner circumferential surface from the V-shaped recesses 106a, 106b,......106n formed in the inner circumferential surface of the major body 2 of the set drum 101, the movement of the stopper 115 is transmitted to the lever 164 via link 165 and the lever 164 is inclined from the solid line position to the two dotted line position as shown in FIG. 4. The sliding plate 135 is slid along the parallel rods 126 by the lever 164 against the retracting force of the spring 136.

As described above, in order to return the lever 164 from the position of the two dotted line to the position of the solid line shown in FIG. 4, the set drum 101 is rotated and the roller 116, provided at the upper end of the stopper 115, is fitted into any one of the V-shaped recesses 106a, 106b,......106n. At this time, the sliding bar 135, retracted by the spring 136, is stopped at the abutted position where the abutting piece 137 integral with the sliding plate 135 is abutted against the set screws positioned above the V-shaped recess into which the roller 116 is fitted.

An indicator mechanism for indicating a stopped position of the sliding plate 135 as described above will now be described.

A small diameter shaft portion 142 of a lower end of the pointer needle shaft 141, which is rotatably inserted into a hollow shaft 148 of said sleeve 140, is slightly smaller than the inner diameter of the sleeve 140 and extends downwardly through a hole 143 provided at the top plate 125 and has a pointer needle pinion 144 engaging with a piece 139 attached thereto. The upper end of the pointer needle shaft 141 extends through a scale plate 145 mounted and fixed on the sleeve 140. The pointer needle 146 is fixed to the upper end of the pointer needle shaft and at the same time a shaft portion of the pointer needle shaft 141, positioned below the fixed portion of the pointer needle 146, is provided with a slit. Movement of the pointer needle shaft 141 is prevented by the washer 147 to be inserted into the slit. The pointer needle 146 is slid and rotated as the sliding plate 135 is slid and stopped. The scale plate 145 and the pointer needle 146 may be used to read out a position in which the roller 116 is inserted into any one of the recesses 106a, 106b,.....106n. The abutting piece 137 of the sliding plate 135 is abutted against the set screw corresponding to a recess into which the roller 116 is inserted and the piece is stopped.

The second embodiment of the present invention constructed as described above and may be preset to enable tuning is described below.

When it is desired to provide a presetting operation in the device shown in FIG. 4, it is possible to tune the desired frequency of a radio station, as in the case of the first embodiment, by rotating the manual knob 158 to rotate the set screws 105a, thereby changing the stroke of the projection of the set screw 5a and adjusting the same.

Subsequently, similar to the first embodiment, in order to abut the set screw 105b adjacent to the set screw 105a, or the set screw 105n against the abutting piece 137, the major portion 102 of the set drum 101 is held by the operator's fingers. When the set drum 1 begins to rotate in a clockwise or counter-clockwise direction, the roller 116 is moved away from the recess 106a used for stepwise movement and the stopper 115 is inclined as shown in FIG. 4 by the two dotted line. As the stopper 115 is inclined, the lever 164 is also inclined via link 165 to a position shown in FIG. 4 by the two dotted line. The sliding plate 135 closely approaches the solenoid coil 131, as in the case of the first embodiment, against the retracting force of the spring 136 by a leading end of the lever 164. When such condition is provided, even if each of the set screws 105a, 105b,......105n is most projected toward a center of the set drum, the abutting piece 137 is not reached. A subsequent set screw 105b or the set screw 105n may be made to oppositely face the abutting piece 137. When the set screw 105a or the set screw 105n is located at a corresponding position, the roller 116 is inserted into a subsequent recess 106b or 106n to be used for stepwise movement, either the set screw 105b or the set screw 105n is then oppositely and resiliently contacted with the abutting piece 137. During this condition, an operation similar to these described above is performed to provide a tuning of the desired frequency of a radio station.

After this presetting operation is completed for all of the set screws 105a, 105b,......105n, the preset radio station may be selected each time a stepwise movement is terminated only by rotating the set drum 101 as was described in connection with the first embodiment.

In a presetting operation, a range of frequency may be calibrated on the scale plate 145 and the presetting operation may be performed for each of said set screws 105a, 105b,......105n with a frequency from the calibrated scale plate 145 as indicated by the pointer needle 146. Likewise, a desired radio station may be selected with the pointer needle 146 indicating the calibration of the scale plate 145 as in the case of the first embodiment.

Lastly, in connection with the description of the third embodiment shown in FIGS. 8 to 11, a comparison between this third embodiment and the second embodiment shows that a major portion 202 of a set drum 201 of the third embodiment to be used for the tuning member is the only difference from the structure of the major body 102 of the set drum 101 of the second embodiment. The other structural elements have almost the same or similar structure. The major body 202 of the set drum 201 will be mainly described and other structural elements will be explained only with respect to their reference numerals.

In FIGS. 8 to 11, reference numeral 201 shows a set drum to be used as a tuning member and reference numeral indicates a main body of the tuner.

The doughnut-shaped major body 202 of the set drum 201 is comprised of or formed by an inner ring 207 and an outer ring 208 to be used for forming the major body.

The set drum 201 is constructed such that an inner circumferential wall surface of the inner ring 207 of doughnut-shaped major body 202, similar to those of the second embodiment, is located at a central position of a main body 220 of the tuner and fixed to the outer face of a bearing 249. The inner race is attached to the outer circumferential surface of a hollow shaft 248 of a sleeve 240 on the top plate 225 of the tuner frame 221. The set drum is rotatably mounted on the main body 220 of the tuner.

Figure 8:
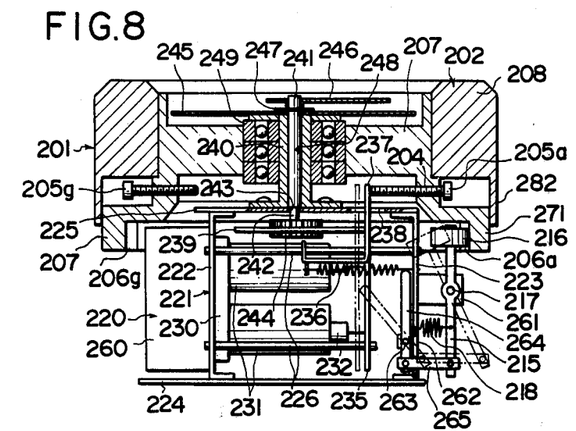
FIG. 8 is a side elevational view with some portions being broken away as in FIG. 1 in order to show an inner structure of third embodiment constructed in accordance with the present invention.
Figure 9:
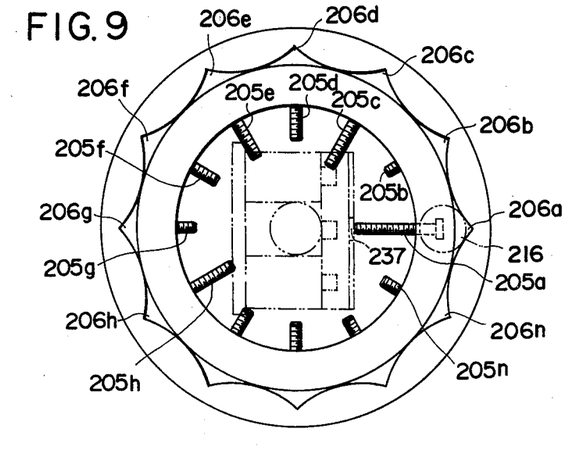
FIG. 9 is a partial view taken from a bottom side of the rotary member in order to show a set condition of the set screw in the third embodiment.
Figure 10:
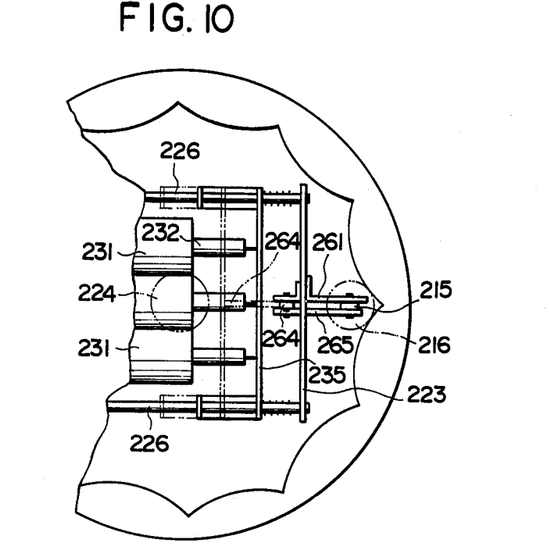
FIG. 10 is a view taken from the bottom side of the third embodiment.
Figure 11:
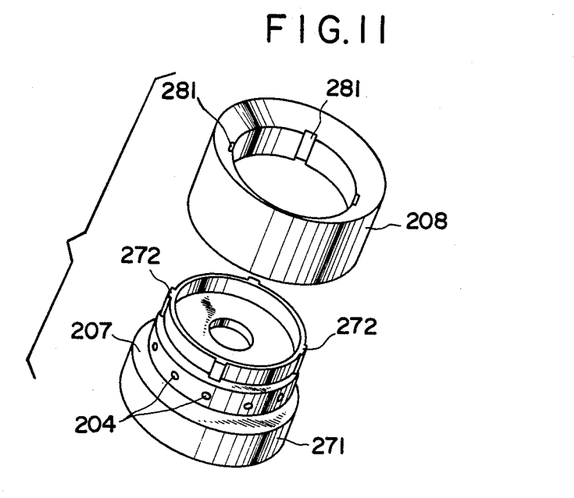
FIG. 11 is a perspective view showing the way in which a driving ring and a rotary member are fitted with each other in the third embodiment.

In particular, as can be seen from FIGS. 8 and 11, the inner circumferential circular wall of flange 271, which is projected from the outer circumferential wall at lower end of said inner ring 207, is, as similar to the first and second embodiments, made to be a rotating surface of a roller 216. The latter is rotatably mounted on the upper end of the stopper 215. The inner circumferential wall is formed with a number of suitably spaced apart V-shaped recesses 206a, 206b,....206n into which the roller 216 is inserted. Above the V-shaped recesses 206a, 206b,....206n, as similar to each of the earlier embodiments, are drilled in a central direction the same number of threaded holes 204 into which the presetting screws 205a, 205b,.....205n are to be threadably engaged. The outer circumferential wall surface above the threaded holes 204 is formed with a plurality of suitably spaced apart ridges 272 in parallel with an axial direction of the inner ring 207.

An inner circumferential wall surface of the outer ring 208, which is to be inserted onto said inner ring 207. That is, a contacting surface contacted with the outer circumferential wall surface of said inner ring 207 is formed with engagement grooves 281 into which a plurality of ridges 272 are engaged. From the lower outer circumferential end is projected downwardly a cover 282 of the flange 271.

Thus, when a major body 202 is formed by covering the outer ring 208 on the inner ring 207, a rotational force which is applied to the outer ring 208 is transmitted to the inner ring 207. Even though the inner ring 207 and the outer ring 208 are rotated in an integrally connected condition, the outer ring 208 may be removed in an axial direction against the inner ring 207. When the outer ring 208 is removed from the inner ring 207 by pulling the outer ring in axial direction, the set screws 205a, 205b,....205n which are threadably engaged with each of the threaded holes 204 of the inner ring 207, are exposed to enable the device to be preset.

The name which will be assigned to each of the structural elements having reference numerals indicated in the drawings of FIGS. 8 to 11 illustrating the third embodiment and which have not been described earlier in the specification will now be described. Reference numeral 217 is a pivot axis, 218 a spring, 222 a left frame, 223 a right frame, 224 a bottom frame, 226 parallel rods, 230 a base, 231 a solenoid coil, 232 a magnetic core (inner core), 235 a sliding plate, 236 a spring, 237 an abutting piece, 238 a longitudinal hole, 239 aa rack piece, 241 a pointer needle shaft, 242 a small diameter portion, 243 a hole, 244 a pointer needle pinion, 245 a scale plate, 246 a pointer needle, 247 a washer, 260 a front end, 261 a projection piece, 262 a longitudinal hole, 263 a pivot axis, 264 a lever, and 265 a linkage. Since the structure formed by these elements is the same as those of the second embodiment, the description on the structure itself and structural relation between each of the elements is not necessary.

Similarly, the manner of presetting and enabling tuning of third embodiment and its overall operational may be easily appreciated from the first and second embodiments, in particular the second embodiment, and thus a description of its operation is not here necessary.

As apparent from the description of each of the foregoing embodiments the rotary preset tuner of the present invention is constructed such that a plurality of set screws of adjustable memory slugs are arranged so that one of the memory slugs is selected to tune a desired frequency by providing a rotational movement to a single set drum used as a tuning member and which may be rotated in any direction. The rotational movement of the tuner member is performed so as to provide tuning by reciprocating and moving the sliding plate via a sliding member. A reciprocating and moving member to be used for reciprocating and moving the sliding plate or a sliding member is connected to the variable tuning member and by resiliently contacting the sliding member with one of the selected memory slugs, there is provided a rotary present tuner differing from the prior art rotary preset tuners. In the tuner of the present invention, due to the fact that non-preferred forces are not applied to the sliding plate or sliding member, long term usage thereof will not cause any change in the accuracy of tuning, even if the tuner is installed in a place where some vibrations are transmitted. Furthermore, the tuner of the present invention is easy to operate, simple in construction, small in size and has a number of tuning radio stations.

The invention may be embodied in other specific forms without departing from its spirit or essential characteristics. The above-described embodiment is, therefore, to be considered in all respects as illustrative and not restrictive, the scope of the invention being indicated by the claims rather than by the foregoing description, and all changes which come within the meaning and range of the equivalents of the claims are therefore intended to be embraced therein.

What we claim is:

1. A rotary present tuner comprising:
   (a) a single tuning member provided with a plurality of adjustable memory slugs capable of being rotated in any direction;
   (b) a sliding member connected to a variable tuner and arranged to move by reciprocating motion along a guide;
   (c) a sliding member reciprocating moving means for providing reciprocating movement to said sliding member by rotational operation of said tuning member; said rotational operation being adapted to select a desired one of the plurality of adjustable memory slugs while said sliding member is reciprocated and moved; said sliding member being in resilient contact with said one of the selected memory slugs to provide tuning; and
   (d) said sliding member reciprocating moving means including recesses provided in the tuning member and a swingable member resiliently fitted in said recesses which cooperatively contacts the sliding member as it disengages from contact with each of the respective recesses of the tuning member due to the rotation of the tuning member, said swingable member further sliding the sliding member in a predetermined direction as it is disengaged from contact with each respective memory slug.

2. A rotary preset tuner as set forth in claim 1 wherein said tuning member further comprises a plurality of threaded holes, and said adjustable memory slugs comprise a plurality of presetting set screws, said holes being spaced apart and said presetting screws being reciprocatably engaged in each of said threaded holes.

3. A rotary preset tuner as set forth in claim 2 wherein the head portions of said set screws are non-circular and are inserted into non-circular holes of the tuner body, said screws being provided with manual knobs.

4. A rotary preset tuner as set forth in claim 1 wherein said tuning member comprises a doughnut-shaped major body containing spaced apart V-shaped recesses at its inner circumferential surface for providing stepwise movement of said tuning member.

5. A rotary preset tuner as set forth in claim 4 wherein said major body also contains a plurality of threaded holes and said adjustable memory slugs comprise a plurality of presetting set screws, said set screws being reciprocally engaged in said threaded holes arranged annularly along the inner circumferential surface.

6. A rotary preset tuner as set forth in claim 1 further comprising a tuning coil and a solenoid coil and a plurality of parallel rods, as inner case of said tuning coil and one end of a moveable iron case of the solenoid coil being provided with a member abutting against the memory slugs for presetting said tuner.

7. A rotary preset tuner as set forth in claim 6 wherein said sliding member is slidably supported by said parallel rods and further comprising a spring for retracting said sliding plate and a switch for energizing said solenoid coil.

8. A rotary preset tuner as set forth in claim 1 wherein a biased roller is filled into V-shaped recesses of an inner circumferential surface of said tuner so that when the roller is moved away from said V-shaped recesses, a switch is turned on by said roller to energize said sliding member which is moved away from said memory slugs by the lever action of a spring.

* * * * *

UNITED STATES PATENT AND TRADEMARK OFFICE
CERTIFICATE OF CORRECTION

PATENT NO. : 4,155,060
DATED : May 15, 1979
INVENTOR(S) : HISAO FUJIMURA

It is certified that error appears in the above-identified patent and that said Letters Patent are hereby corrected as shown below:

Column 5, line 25, "steped" should read -- stepped;

Column 5, line 31, "Ttthese" should read -- These --.

Column 9, line 5, "aa" should read -- a --.

Column 10, line 46, "as" should read -- an --.

Signed and Sealed this

Second Day of October 1979

[SEAL]

Attest:

RUTH C. MASON
Attesting Officer

LUTRELLE F. PARKER
Acting Commissioner of Patents and Trademarks